Figure 1:
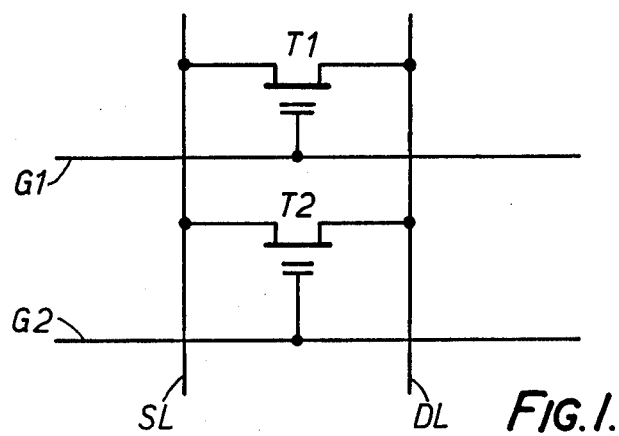

United States Patent [19]

Dickson et al.

[11] 4,064,494

[45] Dec. 20, 1977

[54] CONTENT ADDRESSABLE MEMORIES

[75] Inventors: John Flackett Dickson; Raymond Edward Oakley, both of Northampton, England

[73] Assignee: Plessey Handel und Investments A.G., Zug, Switzerland

[21] Appl. No.: 621,028

[22] Filed: Oct. 9, 1975

[30] Foreign Application Priority Data

Oct. 11, 1974 United Kingdom ............... 44061/74

[51] Int. Cl.$^2$ ............................................. G11C 11/40
[52] U.S. Cl. ...................................... 365/49; 307/238
[58] Field of Search ................... 340/173 R, 173 AM; 307/238, 279

[56] References Cited

U.S. PATENT DOCUMENTS

| 3,705,390 | 12/1972 | Mundy | 340/173 AM |
| 3,936,811 | 2/1976 | Horninger | 340/173 AM |

Primary Examiner—Terrell W. Fears
Attorney, Agent, or Firm—Fleit & Jacobson

[57] ABSTRACT

A content addressable memory comprising for each storage element two non-volatile storage devices which can be non-destructively read and which are adapted to respectively store true and inverse information data, the two devices being interconnected in a manner which is such that information data stored by each device can be simultaneously compared with information data applied to the memory, the input of each of the two devices being connected to a separate terminal.

7 Claims, 4 Drawing Figures

CONTENT ADDRESSABLE MEMORIES

The invention relates to content addressable memories.

In known content addressable memories (CAM) every word i.e. information data, stored in the memory is simultaneously compared with a word or part of a word applied to the memory and an output signal is generated only if a match is found between the applied word and a stored word. The advantage of this arrangement is that a large memory can be searched in parallel thereby effecting a time saving when compared with serial searching memory arrangements and that a saving in memory space is obtained because a search for matching parts of words can be effected without cross-indexing.

Normally each of the CAM storage elements consists of a storage unit and a comparison circuit. This arrangement uses several transistors and occupies a large area so that the number of CAM storage elements that can be accomodated on a chip is rather small i.e. about 16 storage elements in bipolar and about 64 storage elements in MOS.

The invention provides a content addressable memory comprising for each storage element two non-volatile storage devices which can be non-destructively read and which are adapted to respectively store true and inverse information data, the two devices being interconnected in a manner which is such that information data stored by each device can be simultaneously compared with information data applied to the memory, the input of each of the two devices being connected to a separate input terminal. The storage devices are preferably provided by MNOS transistors and the two storage devices associated with each storage element can be connected in parallel or in series.

The foregoing and other features according to the invention will be better understood from the following description with reference to the accompanying drawings, in which:

FIG. 1 diagrammatically illustrates one arrangement for each storage element of the content addressable memory according to the inventor.

Figure 2:
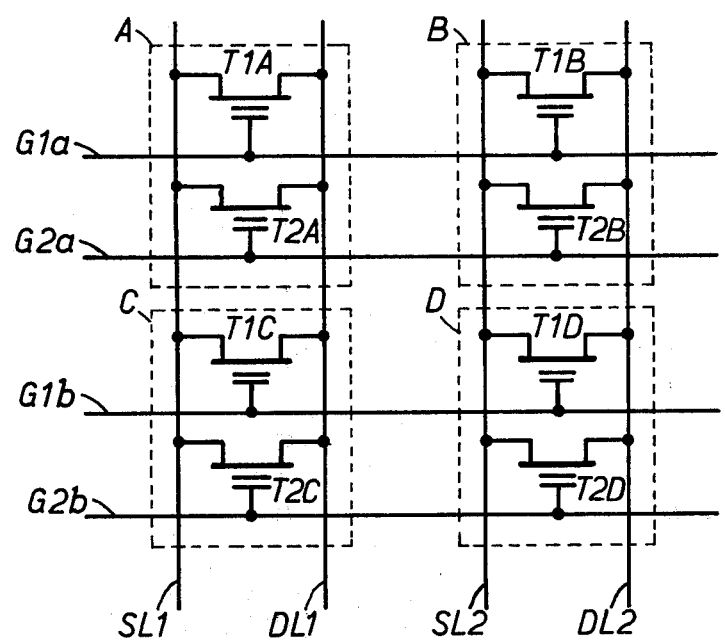

FIG. 2 diagrammatically illustrates an array of the storage elements of FIG. 1.

Figure 3:
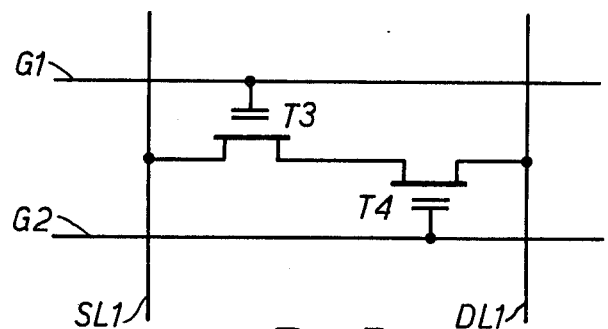
Figure 4:
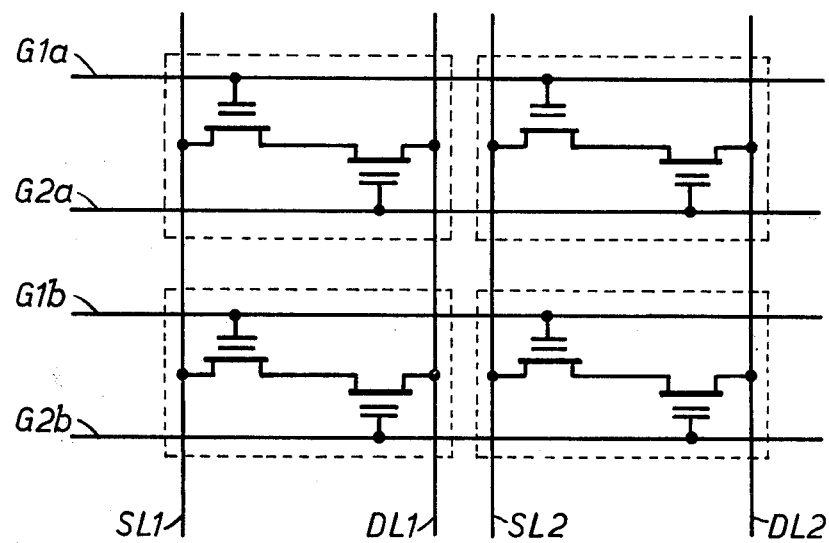

FIG. 3 diagrammatically illustrates another arrangement for each storage element of the content addressable memory according to the invention and FIG. 4 diagrammatically illustrates an array of the storage elements of FIG. 3.

The content addressable memory according to the invention is basically comprised of an array of storage elements each consisting of two non-volatile storage devices which can be non-destructively read and which are adapted to respectively store true and inverse information data. Thus the size of each storage element is very small in comparison to the storage elements of known CAM'S and CAM'S of 1 K bit or larger can readily be realised. In addition to the increase in packing density, the storage devices are non-volatile so that the stand-by power dissipation is zero.

The storage devices can be provided by any form of IC memory cell, plated-wire or special NDRO cores but are preferably provided by MNOS transistors wherein data is represented by high and low voltage threshold levels. The advantage of an MNOS transistor over other storage devices is its simplicity and packing density.

A storage element which utilizes two MNOS transistors T1 and T2 connected in parallel is illustrated in FIG. 1 of the drawings. The source electrodes of the transistors T1 and T2 are connected to a common supply lead SL and the drain electrodes are connected to a common supply lead DL. Supply leads G1 and G2 are respectively provided for the gate electrodes of the transistors T1 and T2.

During a write operation, which will be subsequently outlined, true information data is written into and stored by the transistor T1 and the inverse of this information data is written into and stored by the transistor T2. During a read operation which will also be subsequently outlined, true and inverse information data patterns are respectively applied to the gate leads G1 and G2 and if the patterns and the information data stored by the transistors T1 and T2 match then no current will flow between the source and drain electrodes of the transistors. However, if the information data is not matched then current will flow between the source and drain electrodes of the transistors. For example, if the stored data is binary "1" then the transistor T1 will have a high voltage threshold $V_t$ and the transistor T2 will have a low $V_t$. If under these conditions the true data applied to the storage element is also a binary "1", then a read voltage $V_R$ at the gate of transistor T1 will be at a voltage between the high (H) and low (L) $V_t$ levels of this transistor and the signal at the gate of transistor T2 will be zero volts. Thus, neither transistor will be switched on and, therefore, no current will flow between source and drain electrodes. However, if the true data applied to the storage element under the exampled conditions is a binary "0", then the signal at the gate of transistor T1 will be zero volts and the gate of transistor T2 will be at the voltage $V_R$. Thus, the transistor T1 will still be switched off ($V_{tH} > 0$) but the transistor T2 will be switched on ($V_{tL} < V_R$) and current flow between its source and drain electrodes.

A number of the storage elements of FIG. 1 can, as is diagrammatically illustrated in FIG. 2 of the drawings, be arranged in an array having source columns SL1, SL2, drain columns DL1, DL2 and pairs of gates in rows G1a/G2a, G1b/G2b The storage elements A,B,C and D provide a two word by two-bit CAM array wherein each word is associated with a separate pair of source columns SL1/DL1, SL2/DL2 and wherein each bit of a word is associated with a separate pair of gate rows G1a/G2a, G1b/G2b. During the read operation the information data to be compared with the stored data is applied to the gate rows G1a/G2a, G1b/G2b and each storage element will function in a manner as previously outlined to provide a current flow between the source and drain electrodes of a transistor only when the stored information data is not perfectly matched with the applied information data. If only part of a word is to be compared with, say the bits associated with the storage elements A and B, the true and inverse information data associated with that part of the word would be respectively applied to the gate rows G1a and G2a and the gate rows G1b and G2b would be connected to earth potential. Thus the transistors associated with the storage elements C and D and the other bit of the applied word will remain in an "off" state regardless of their contents and these transistors will not affect the matching of the bits in the applied information data pattern. All the words in the CAM are compared simultaneously because the gates associated with corresponding bits of each of the stored words are connected together by the gate rows G1a/G2a, G1b/G2b and each bit of the data pattern is, therefore, compared with the appropriate bit of each of the stored words.

During the write operation, the contents of the CAM are first of all erased by biassing the gates of the appropriate storage element or elements positively with respect to the substrate on which the MNOST'S are formed. This biasing causes the $V_t$ of each transistor to be shifted to the low state ie to $V_{tL}$. All unselected words are held negative ie the word lines such as SL1/DL1, SL2/DL2 are negatively biased, the selected word is grounded ie the word lines such as SL1/DL1, SL2/DL2 are connected to earth potential, and the true and inverse information data is applied to the pairs of gates via the gate rows such as G1a/G2a, G1b/G2b. A binary "1" is a large negative voltage. In the selected word, the $V_t$ of a transistor will shift to a high value $V_{tH}$ when the gate is negative but will remain low ie at $V_{tL}$, when the gate is at zero volts. In the unselected words the negative bias on the associated word lines inhibits the shift and holds all the bits in their $V_{tL}$ state. Thus whilst each word is written into the memory in the specified manner the previously stored words are protected by the inhibit voltage applied to the associated word lines.

For example, in order to write a word '10' into the storage elements A and C of FIG. 2, the word lines SL1 and DL1 are connected to earth potential and the other word lines, such as SL2/DL2, are not selected and are, therefore, negatively biased up to the write voltage, for example — 40 volts. The bit associated with the storage element A is to be a binary '1' therefore the true data of — 40 volts is applied to the gate row G1a and the inverse of zero volts is applied to the gate row G2a. The bit associated with the storage element C is to be a binary "0" therefore the true data of zero volts is applied to the gate row G1b whilst the inverse data of — 40 volts is applied to the gate row G2b. Thus the word '10' appears as — 40V, 0V, 0V, — 40V on the four gate rows of FIG. 2.

The transistors T1A and T2C have — 40 volts on their gate and zero volts on the source and drain electrodes therefore the $V_t$ of each of these transistors is shifted to the $V_{tH}$ state. The transistors T2A, T1C, T2B and T1D each have zero volts on their gate and therefore the $V_t$ of each of these transistors will remain in the $V_{tL}$ state. The transistors T1B and T2D each have — 40 volts on their gate, source and drain electrodes therefore the shift of the $V_t$ of each of these two transistors is inhibit and will remain in the $V_{tL}$ state.

The stored data can then be read in a manner as previously outlined.

In another arrangement for the storage elements of the CAM according to the invention the two MNOST'S can, as is diagrammatically illustrated in FIG. 3 of the drawings, be connected in series, the drain electrode of one of the transistors T3 being connected to the source electrode of the other transistor T4. The source of the transistor T3 is connected to the word line SL1, the drain of the transistor T4 is connected to the word line DL1 and the gates of the transistors T3 and T4 are respectively connected to the gate rows G1 and G2.

As with the arrangement of FIG. 1, the information data is stored as true and inverse data in the two transistors, and is read by true and inverse data signals applied to the gate rows G1 and G2. However during the reading operation with this arrangement of transistors, a binary "1" is greater than $V_{tH}$ and $V_{tL}$<binary "0"<$V_{tH}$. When the true data stored by this storage element is a binary "1" then the application of a binary "1" signal to the gate row G1 will cause the transistor T3 to conduct and the application of the inverse binary "0" signal to the gate row G2 will cause the transistor T4 to conduct therefore current will flow between the word lines SL1 and DL1 for a data match. If the information data does not match then the signal applied to the gate row G1 will be a binary "0", ie $V_{tH}$, and therefore the transistor T3 will not conduct and as a result no current will flow between the word lines.

This arrangement for the storage elements has two advantages over the parallel arrangement of FIG. 1 in that it can be physically smaller and current flows only for matched data thereby causing a reduction in the power consumption of the CAM.

As with the arrangement of FIG. 1, a number of the storage elements of FIG. 3 can, as is diagrammatically illustrated in FIG. 4 of the drawings, be arranged in an array having word lines SL1/DL1, SL2/DL2 and gate rows GLa/G2a, G1b/G2b.

In a practical arrangement, the number of drain columns could, in either of the arrays of FIGS. 2 and 4, be reduced in order to effect a saving in memory space by having a common drain column for each pair of adjacent columns i.e. the drain columns DL1 and DL2, of an array.

It can therefore, be seen from the foregoing that because the storage elements are MNOS transistors the data comparison is achieved without disturbing the stored data i.e. non-destructive read out is inherently provided and the data can be stored without power i.e. non-volatility is inherently provided.

It is to be understood that the foregoing description of specific examples of this invention is made by way of example only and is not to be considered as a limitation in its scope.

What is claimed is:

1. A content addressable memory comprising a plurality of storage elements, each said storage element comprising two non-volatile storage devices, having inputs, which can be non-destructively read and which are adapted to respectively store true and inverse information data, a pair of input terminals for receiving input information data, means for connecting said input of each of said storage devices with a separate input terminal, means for storing true information data in one of said storage devices, for storing inverse information data in the other of said storage devices, and for simultaneously comparing said input information data with said true and inverse information data stored in said storage devices.

2. A content addressable memory as claimed in claim 1 wherein said storage elements are arranged in rows and columns in the form of a two dimensional array, wherein each row of storage elements is associated with a separate pair of input terminals, the said inputs of the two storage devices of each storage element of a row being connected to a separate one of the associated pair of input terminals, and wherein each column of storage elements has first and second electrical supply leads associated therewith.

3. A content addressable memory as claimed in claim 1 wherein said storage devices are MNOS transistors having gate electrodes, said inputs of said storage devices comprising said gate electrodes.

4. A content addressable memory as claimed in claim 2 wherein said storage devices comprise MNOS transistors having source and drain electrodes, and wherein said means for storing true and inverse information data and for comparing comprise the connection of the storage devices of each storage element in parallel by the connection of the source electrodes of the two transistors of each of the storage elements of a column to the associated first electrical supply lead and the connection of the drain electrodes of the two transistors of each of the storage elements of a column to the associated second electrical supply lead.

5. A content addressable memory as claimed in claim 2 wherein said storage devices comprise MNOS transistors having source and drain electrodes, and wherein said means for storing true and inverse information data, and for comparing comprise the connection of the storage devices of each storage element in series by the connection of the drain electrode of one of the transistors to the source electrode of the other transistor, the connection of the source electrode of the said one of the transistors of each of the storage elements of a column to the associated first electrical supply lead and the connection of the drain electrode of the said other transistor of each of the storage elements of a column to the associated second electrical supply lead.

6. A content addressable memory as claimed in claim 4 wherein each pair of adjacent columns of storage elements have a common second electrical supply lead.

7. A content addressable memory as claimed in claim 5 wherein each pair of adjacent columns of storage elements have a common second electrical supply lead.

* * * * *